(12) United States Patent
Sugimura

(10) Patent No.: US 12,055,598 B2
(45) Date of Patent: Aug. 6, 2024

(54) BATTERY MONITORING SYSTEM AND SEMICONDUCTOR DEVICE

(71) Applicant: c/o Lapis Semiconductor Co., Ltd., Kanagawa (JP)

(72) Inventor: Naoaki Sugimura, Kanagawa (JP)

(73) Assignee: Lapis Semiconductor Co., Ltd., Kanagawa (JP)

( * ) Notice: Subject to any disclaimer, the term of this patent is extended or adjusted under 35 U.S.C. 154(b) by 0 days.

(21) Appl. No.: 18/337,485

(22) Filed: Jun. 20, 2023

(65) Prior Publication Data

US 2023/0366950 A1 Nov. 16, 2023

Related U.S. Application Data

(63) Continuation of application No. 17/355,975, filed on Jun. 23, 2021, now Pat. No. 11,719,756, which is a continuation of application No. 16/684,626, filed on Nov. 15, 2019, now Pat. No. 11,073,569, which is a continuation of application No. 15/397,830, filed on Jan. 4, 2017, now Pat. No. 10,502,795, which is a (Continued)

(30) Foreign Application Priority Data

Jul. 18, 2012 (JP) .................................. 2012-159958

(51) Int. Cl.
*G01R 31/396* (2019.01)
*G01R 31/3835* (2019.01)
*H01M 10/42* (2006.01)
*H01M 10/48* (2006.01)

(52) U.S. Cl.
CPC ....... *G01R 31/396* (2019.01); *G01R 31/3835* (2019.01); *H01M 10/425* (2013.01); *H01M 10/482* (2013.01); *H01M 2010/4271* (2013.01); *H01M 2200/00* (2013.01)

(58) Field of Classification Search
CPC ............. G01R 31/396; G01R 31/3835; H01M 10/425; H01M 10/482; H01M 2010/4271; H01M 2200/00; Y02E 60/10
USPC ......................................................... 324/434
See application file for complete search history.

(56) References Cited

U.S. PATENT DOCUMENTS

| 4,779,051 A | * | 10/1988 | Grunewald | .......... G01R 31/343 324/536 |
| 4,833,459 A | * | 5/1989 | Geuer | .................. G01R 31/396 340/636.12 |

(Continued)

FOREIGN PATENT DOCUMENTS

| CN | 102308433 A | * | 1/2012 | .......... H01M 10/441 |
| JP | 2011-096897 A | | 5/2011 | |

*Primary Examiner* — M Baye Diao
(74) *Attorney, Agent, or Firm* — Kubotera & Associates, LLC

(57) ABSTRACT

A battery monitoring system includes a first group of a plurality of battery cells connected in series and including a first battery cell at a highest potential and a second battery cell at a lowest potential; a second group of a plurality of battery cells connected in series and including a third battery cell at a highest potential and a fourth battery cell at a lowest potential, the second group of the battery cells being connected to the first group of the battery cells in series; and first and second semiconductor devices capable of measuring a voltage of the first group of the battery cells and a voltage of the second group of the battery cells, respectively.

5 Claims, 5 Drawing Sheets

Related U.S. Application Data continuation of application No. 13/939,280, filed on Jul. 11, 2013, now Pat. No. 9,575,129.

(56) References Cited

U.S. PATENT DOCUMENTS

| | | | | |
|---|---|---|---|---|
| 5,638,002 A * | 6/1997 | Perelle | ............. | G01R 31/396 340/636.15 |
| 6,150,795 A * | 11/2000 | Kutkut | ............. | H02J 7/0018 320/118 |
| 6,157,171 A * | 12/2000 | Smith | ............. | G01R 19/16542 320/136 |
| 6,762,588 B2 * | 7/2004 | Miyazaki | ............. | H02J 7/0016 320/116 |
| 7,869,174 B2 * | 1/2011 | Tanaka | ............. | H01L 27/0251 361/56 |
| 7,969,119 B2 * | 6/2011 | Odaohhara | ............. | H02J 7/04 320/134 |
| 8,089,242 B2 * | 1/2012 | Loudot | ............. | H02J 7/34 180/2.2 |
| 8,625,239 B2 * | 1/2014 | Okushima | ............. | H03K 17/162 361/56 |
| 9,340,122 B2 * | 5/2016 | Yamauchi | ............. | B60L 58/15 |
| 2009/0009143 A1 * | 1/2009 | Odaohhara | ............. | H02J 7/007182 320/162 |
| 2010/0283473 A1 * | 11/2010 | Vandensande | ............. | H02J 7/0048 324/434 |
| 2011/0298424 A1 * | 12/2011 | Yamauchi | ............. | B60L 58/12 320/118 |
| 2012/0182022 A1 * | 7/2012 | Kinouchi | ............. | H01M 10/488 324/435 |
| 2012/0280572 A1 * | 11/2012 | Li | ............. | H02J 7/00308 307/77 |
| 2013/0320991 A1 * | 12/2013 | Kiuchi | ............. | G01R 31/382 324/434 |
| 2015/0241520 A1 * | 8/2015 | Ohtake | ............. | G01R 31/396 324/434 |

\* cited by examiner

BATTERY MONITORING SYSTEM AND SEMICONDUCTOR DEVICE

CROSS-REFERENCE TO RELATED APPLICATIONS

This is a continuation application of a prior application Ser. No. 17/355,975, filed on Jun. 23, 2021, allowed, which is a continuation application of a prior application Ser. No. 16/684,626, issued on Jul. 27, 2021 as U.S. Pat. No. 11,073,569, which is a continuation application of a prior application Ser. No. 15/397,830, issued on Dec. 10, 2019 as U.S. Pat. No. 10,502,795, which is a continuation application of a prior application Ser. No. 13/939,280, issued on Feb. 21, 2017 as U.S. Pat. No. 9,575,129.

BACKGROUND OF THE INVENTION AND RELATED ART STATEMENT

The present invention relates to a battery monitoring system and a semiconductor device. More specifically, the present invention relates to a battery monitoring system and a semiconductor device suitable for monitoring a plurality of batteries connected in series.

In general, a high capacity and high output battery has been used for driving a motor of a hybrid automobile or an electric automobile, and the like. The high capacity and high output battery may be formed of a battery unit (for example, a lithium-ion battery unit), in which a plurality of batteries (battery cells) is connected in series. A conventional battery monitoring system has been developed for monitoring a voltage of the batteries of the battery unit.

As the conventional battery monitoring system, there has been known a configuration thereof, in which a highest potential (a potential at the highest level) of the batteries connected in series is supplied to a semiconductor device as a drive power source of an internal circuit of the semiconductor device having a battery monitoring circuit (a battery measurement circuit).

Patent Reference No. 1 has disclosed the conventional battery monitoring system. The conventional battery monitoring system disclosed in Patent Reference No. 1 is provided with a battery cell controller, in which a voltage of the highest potential of the battery cells supplied through a VCC terminal is used for driving the internal circuit thereof. In the battery cell controller of the conventional battery monitoring system disclosed in Patent Reference No. 1, a main constant voltage power source (a regulator) is provided for converting the voltage of the highest potential of the battery cells to a voltage for driving the internal circuit and the like.

Patent Reference No. 1: Japanese Patent Publication No. 2010-16928

Patent Reference No. 2 has disclosed a conventional technology, in which an electro-static charge protection circuit is provided in a semiconductor device for preventing damage on the internal circuit of the semiconductor device caused by electro-static charge. In the conventional technology disclosed in Patent Reference No. 2, the semiconductor device includes an ESD (Electro-Static Discharge) protection diode for discharging a high voltage noise due to the electro-static charge to a power source terminal.

Patent Reference No. 2: Japanese Patent Publication No. 2011-96897

FIG. 5 is a schematic diagram showing a configuration of a conventional battery monitoring system 100 having the electro-static charge protection circuit. In the conventional battery monitoring system 100 shown in FIG. 5, the electro-static charge protection circuit disclosed in Patent Reference No. 2 is disposed in the semiconductor device of the conventional battery monitoring system (refer to Patent Reference No. 1), so that it is possible to prevent damage caused by the electro-static charge on the internal circuit of the semiconductor device of the conventional battery monitoring system.

As shown in FIG. 5, the conventional battery monitoring system 100 includes a battery cell unit 112, in which a plurality of battery cells C (C1 to Cn) is connected in series, and a semiconductor device 120 connected to the battery cell unit 112 through low pass filters LPF (LPF1 to LPFn, and LPFvcc). Further, the semiconductor device 120 includes a battery cell voltage measurement circuit 122. The battery cell voltage measurement circuit 122 includes a regulator for converting a power source voltage Vcc supplied to the battery cell voltage measurement circuit 112 to a drive voltage, and an electrical current driven type circuit such as an internal processing circuit to be driven with the drive voltage converted with the regulator.

In the conventional battery monitoring system 100 as shown in FIG. 5, the power source terminal Vcc of the semiconductor device 120 is connected to a battery cell input signal line Ln through the low pass filter LPFvcc, and the battery cell input signal line Ln is connected to a high potential side of the battery cell Cn of the battery cell unit 112 on the highest potential level. Accordingly, the power source voltage Vcc is supplied to the semiconductor device 120 (the power source terminal Vcc) through the battery cell input signal line Ln.

In the conventional battery monitoring system 100, the power source terminal Vss of the semiconductor device 120 is connected to a battery cell input signal line L0, and the battery cell input signal line L0 is connected to a low potential side of the battery cell C1 of the battery cell unit 112 at the lowest potential level. Further, the power source line Vcc connected to the power source terminal Vcc and the power source line Vss connected to the power source terminal Vss are connected to an inter-power source ESD protection circuit 124.

In the conventional battery monitoring system 100, cell input terminals V (V1 to Vn) of the semiconductor device 120 are connected to cell input signal lines L (L1 to Ln) that are connected to the high potential side of each of the battery cells C1 to Cn through the low pass filters LPF (LPF1 to LPFn), respectively. Further, the cell input terminals V (V1 to Vn) of the battery cells C1 to Cn are connected to the battery cell voltage measurement circuit 122 through the cell input signal lines L (L1 to Ln) that are connected to ESD protection diodes ESD (ESD1 to ESDn), respectively.

In the conventional battery monitoring system 100, the low pass filters LPF (LPF1 to LPFn) have a function of removing an external turbulent noise contained in the cell voltage input thereto. Further, the low pass filter LPFvcc has a function of preventing a potential from generating between the power source terminal Vcc and the cell input terminals V (V1 to Vn) due to a phase difference upon passing through the low pass filters LPF (LPF1 to LPFn), and has a characteristic similar to that of the low pass filters LPF (LPF1 to LPFn).

In the conventional battery monitoring system 100, the ESD protection diodes ESD (ESD1 to ESDn) have a function of discharging a high voltage noise due to the electro-static charge and the like to the power source terminal Vcc or the power source terminal Vss (the inter-power source ESD protection circuit 124).

In the conventional battery monitoring system 100 having the configuration described above, during the normal operation (that is, when the voltage of the battery cells C is measured, and the like), an electrical current Icc flows into the power source line Vcc (the battery cell voltage measurement circuit 122, the regulator, and the like) through the power source terminal Vcc. More specifically, the power source line Vcc is connected to the circuit of the electric current driven type such as the battery cell voltage measurement circuit 122, the regulator, and the like. Accordingly, the electrical current Icc (the power consumption current Icc) flows into the power source line Vcc for driving the circuit of the electric current driven type.

When the electrical current Icc flows into the power source line Vcc, a voltage drop occurs due to a resistor Rvcc of the low pass filter LPFVcc. If the voltage drop exceeds a diode forward direction voltage of the ESD protection diode ESDn, even during the normal operation, an electrical current may flow into the power source terminal Vcc (the inter-power source ESD protection circuit 124) from the battery cell Cn through the ESD protection diode ESDn. When such an electrical current flows into the power source terminal Vcc, the voltage of the cell input terminals V (V1 to Vn) decreases. As a result, the voltage drop at the cell input terminals V (V1 to Vn) causes a measurement error of the battery voltage of the battery cells C (C1 to Cn) in the battery cell voltage measurement circuit 122.

In order to prevent the voltage drop caused by the resistor Rvcc of the low pass filter LPFVcc, the conventional battery monitoring system 100 may be configured such that the cell input signal line Ln is directly connected to the power source terminal Vcc without passing through the low pass filter LPFvcc. When the cell input signal line Ln is directly connected to the power source terminal Vcc, it is possible to prevent the voltage drop caused by the resistor Rvcc of the low pass filter LPFVcc. In this case, however, the following problems may occur.

As described above, in the conventional battery monitoring system 100, the battery cell unit 112 is configured to supply the voltage to the device (for example, a motor and the like) to drive the device. When a noise is generated in the device due to driving of the device (for example, a startup power and the like), the voltage of the battery cell unit 112 as a whole may be fluctuated. When the cell input signal line Ln is directly connected to the power source terminal Vcc without passing through the low pass filter LPFvcc, the potential of the power source terminal Vcc may become lower than the potential of the cell input terminals V (V1 to Vn) due to an influence of the noise. When the potential of the power source terminal Vcc becomes lower than the potential of the cell input terminals V (V1 to Vn), the electrical current flows from the battery cells C (C1 to Cn) to the power source terminal Vcc (the inter-power source ESD protection circuit 124) through the ESD protection diodes ESD (ESD1 to ESDn).

As described above, in the conventional battery monitoring system 100, even in the normal operation, the electrical current may flow from the battery cells C (C1 to Cn) to the power source terminal Vcc (the inter-power source ESD protection circuit 124) through the ESD protection diodes ESD (ESD1 to ESDn).

In view of the problems described above, an object of the present invention is to provide a battery monitoring system capable and a semiconductor device of solving the problems of the conventional battery monitoring system. In the present invention, in the normal operation, it is possible to prevent an electrical current from flowing to a discharge circuit from a battery cell through an electro-static charge protection circuit.

Further objects and advantages of the invention will be apparent from the following description of the invention.

SUMMARY OF THE INVENTION

In order to attain the objects described above, according to a first aspect of the present invention, a battery monitoring system includes a plurality of battery cells connected in series and including a first battery cell at a highest potential; a discharge circuit connected to a high potential side of the first battery cell through a first line; a circuit connected to the high potential side of the first battery cell through a second line; and a plurality of electro-static protection circuits each including one end portion connected to at least one of a high potential side and a low potential side of each of the battery cells, and another end portion connected to the first power source line.

According to a second aspect of the present invention, a battery monitoring system includes a plurality of battery cells connected in series and including a first battery cell at a highest potential; and a semiconductor device capable of measuring a voltage of the battery cells.

According to the second aspect of the present invention, the semiconductor device includes a first terminal connected to a high potential side of the first battery cell through a first filter; a second terminal electrically connected to the high potential side of the first battery cell through a second filter; and a plurality of third terminals each connected to at least one of a high potential side and a low potential side of each of the battery cells. The semiconductor device further includes a discharge circuit connected to the first terminal; a circuit connected to the second terminal; and a plurality of electro-static protection circuits each including one end portion connected to each of the third terminals, and another end portion connected to the discharge circuit.

According to a third aspect of the present invention, a semiconductor device is capable of measuring a voltage of a plurality of battery cells connected in series.

According to the third aspect of the present invention, the semiconductor device includes a first terminal connected to a high potential side of the first battery cell through a first filter; a second terminal connected to the high potential side of the first battery cell through a second filter; and a plurality of third terminals each connected to at least one of a high potential side and a low potential side of each of the battery cells. The semiconductor device further includes a discharge circuit connected to the first terminal; a circuit connected to the second terminal; and a plurality of electro-static protection circuits each including one end portion connected to each of the third terminals, and another end portion connected to the discharge circuit.

According to the present invention, it is possible to prevent an electric current from flowing to the discharge circuit from the battery cells through the electro-static protection circuit in a normal operation.

DETAILED DESCRIPTION OF PREFERRED EMBODIMENTS

Hereunder, preferred embodiments of the present invention will be explained with reference to the accompanying drawings.

First Embodiment

Figure 1:
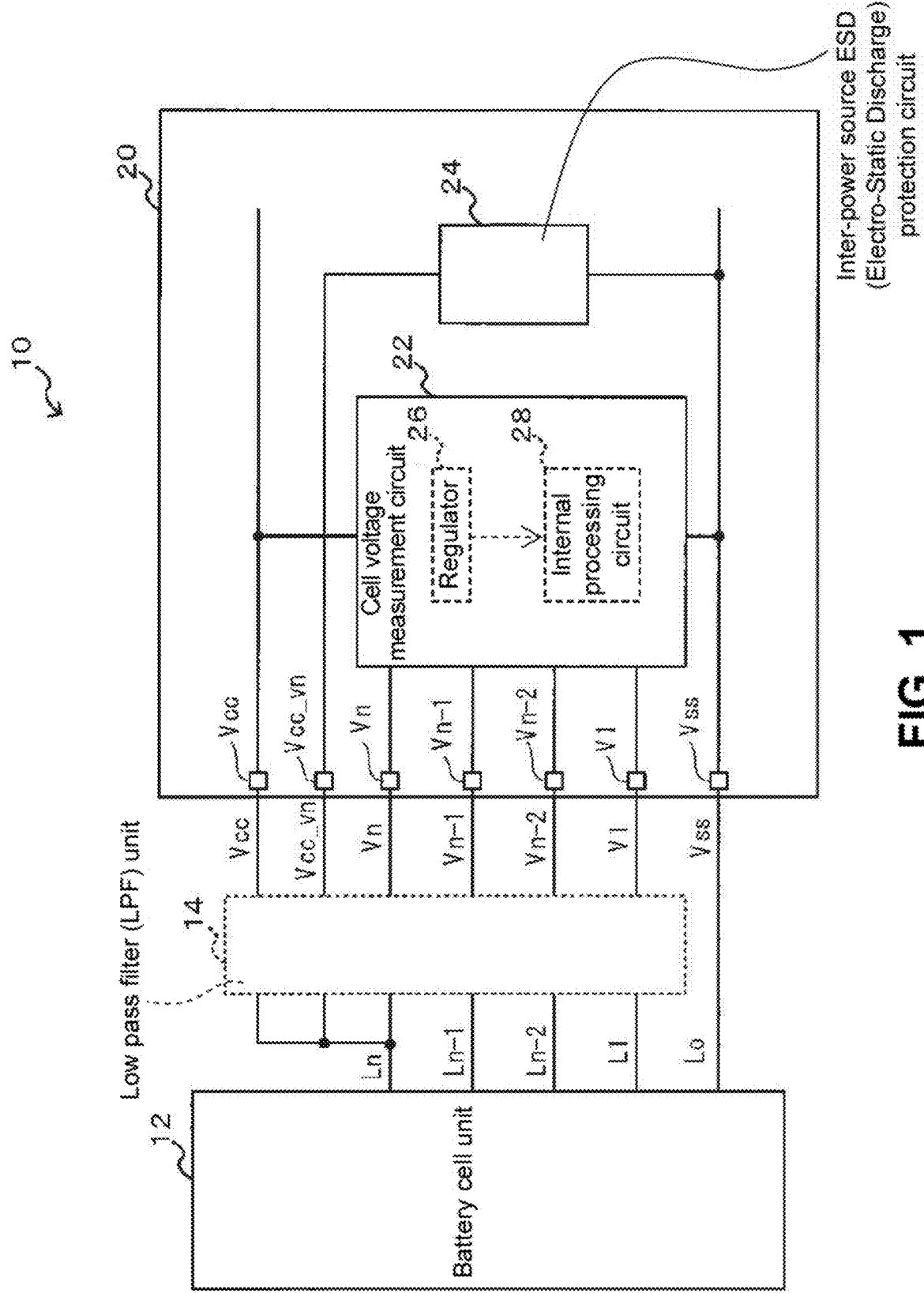
FIG. 1 is a schematic diagram showing a configuration of a battery monitoring system according to a first embodiment of the present invention.

A first embodiment of the present invention will be explained. First, a configuration of a battery monitoring system 10 according to the first embodiment of the present invention will be explained. FIG. 1 is a schematic diagram showing the configuration of the battery monitoring system 10 according to the first embodiment of the present invention.

As shown in FIG. 1, the battery monitoring system 10 includes a battery cell unit 12 including a plurality of battery cells and a semiconductor device 20 for measuring a voltage of each of the battery cells of the battery cell unit 12.

In the first embodiment, the battery cell unit 12 is connected to the semiconductor device 20 through a low pass filter (LPF) unit 14 for eliminating an external turbulent noise. More specifically, the battery cell unit 12 is connected to the semiconductor device 20 through the LPF unit 14 and no low pass filter (LPF) is connected to a power source line Vss, so that each of low pass filters (LPFs) of the low pass filter (LPF) unit 14 is configured to bypass the external turbulent noise to the power source line Vss.

As described above, in the first embodiment, no low pass filter (LPF) is connected to the power source line Vss. Alternatively, the power source line Vss may be connected to the semiconductor device 20 through a low pass filter (LPF). When no low pass filter (LPF) is connected to the power source line Vss, it is possible to prevent a circuit scale of the battery monitoring system 10 from excessively increasing.

In the first embodiment, the semiconductor device 20 includes a cell voltage measurement circuit 22 and an inter-power source ESD (Electro-Static Discharge) protection circuit 24. The cell voltage measurement circuit 22 includes a regulator 26 and an internal processing circuit 28. The internal processing circuit 28 is a processing circuit for measuring the voltage of the battery cell C (C1 to Cn, refer to FIG. 2). It should be noted that the internal processing circuit 28 may be formed of a plurality of circuits.

In the first embodiment, the regulator 26 has a function of converting a power source voltage Vcc supplied from the battery cell unit 12 through a power source terminal Vcc to a voltage for driving the internal processing circuit 28. The regulator 26 is formed of an electrical current driven type circuit. It may be configured such that the voltage converted by the regulator 26 is supplied to other internal circuit of the semiconductor device 20 as a drive voltage thereof. It should be noted that the regulator 26 may be disposed outside the cell voltage measurement circuit 22.

In the first embodiment, at least in the normal operation, the battery monitoring system 10 is configured such that the power source voltage Vcc is constantly supplied to the cell voltage measurement circuit 22 (the regulator 26) from the high potential side of the battery cells Cn through the power source terminal Vcc with a cell input signal line Ln. Accordingly, an electrical current Icc flows into the cell voltage measurement circuit 22 (the regulator 26).

In the first embodiment, the inter-power source ESD protection circuit 24 has a function of discharging a discharge current from ESD (Electro-Static Discharge) protection diodes (ESD1 to ESDn). The inter-power source ESD protection circuit 24 is connected between a terminal Vcc_vn and the power source terminal Vss. Further, the inter-power source ESD protection circuit 24 is connected to a power source line Vcc_vn different from the power source line Vcc connected to the electrical current driven type circuit such as the regulator 26 and the like. It should be noted that the power source line that is connected to the inter-power source ESD protection circuit 24 is not limited to the power source line Vcc_vn, and may be any power source line as far as the power source line is not connected to the electrical current driven type circuit.

Figure 2:
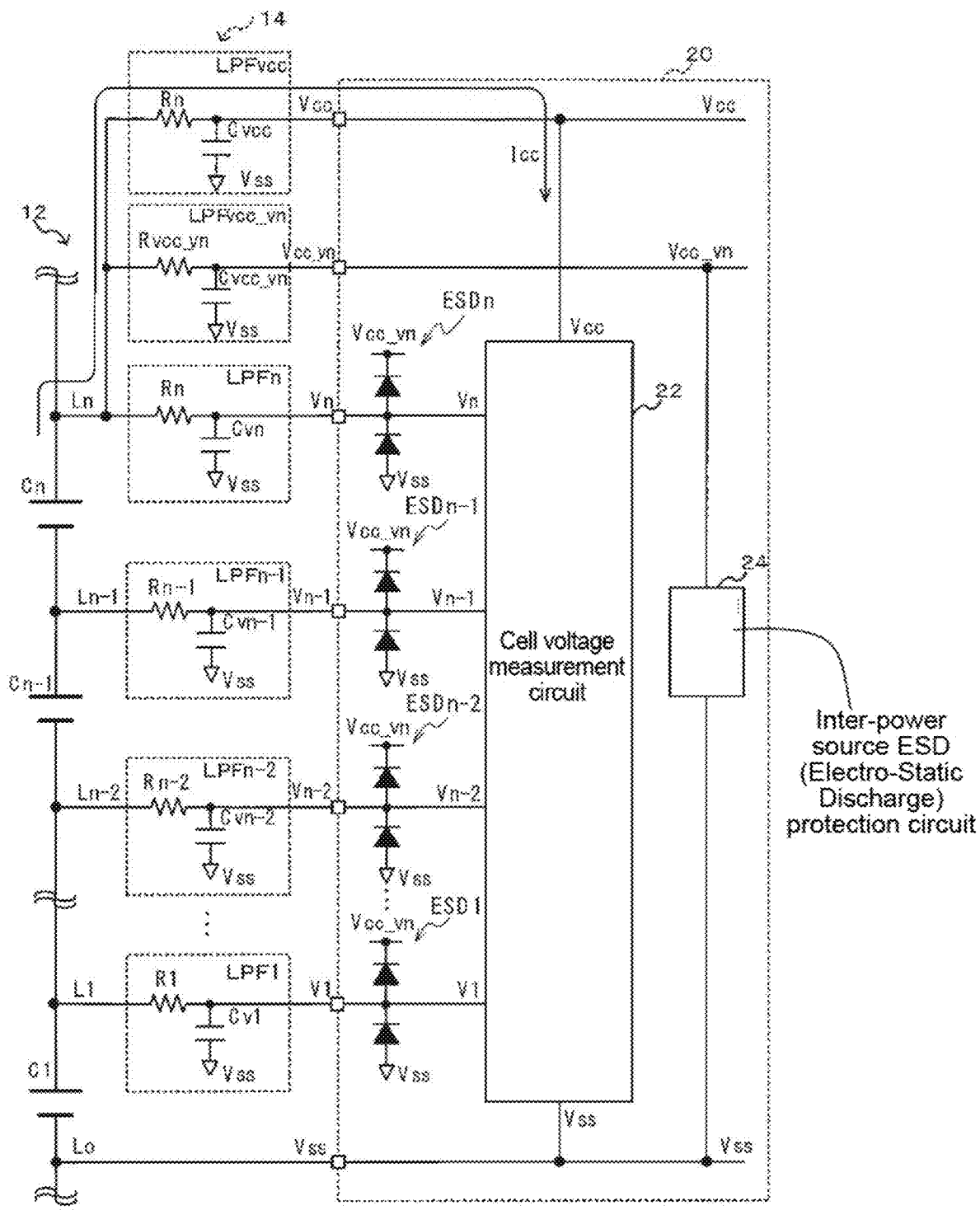
FIG. 2 is a schematic diagram showing a battery cell unit and a semiconductor device of the battery monitoring system according to the first embodiment of the present invention.

A connection configuration of the battery cell unit 12 and the semiconductor device 20 in the battery monitoring system 10 will be explained next. FIG. 2 is a schematic diagram showing the battery cell unit 12 and the semiconductor device 20 of the battery monitoring system 10 according to the first embodiment of the present invention. As shown in FIG. 2, the battery cell unit 12 is formed of the battery cells C (C1 to Cn) connected in series. It should be noted that the battery cell unit 12 includes the battery cell Cn on the highest potential side and the battery cell C1 on the lowest potential side.

In the first embodiment, the low pass filters LPF (LPF1 to LPFn) have a function of suppressing a rapid voltage variance generated in each of the battery cells C (C1 to Cn) of the battery cell unit 12 through cutting a high frequency component. The low pass filters LPF (LPF1 to LPFn) are connected to the cell input signal lines L (L1 to Ln) of the battery cells C (C1 to Cn) on the high potential side. It should be noted that the low pass filters LPF (LPF1 to LPFn) are formed of a filter having an identical characteristic, so that a variance in the cell voltage is not generated due to a potential difference caused by a phase difference upon passing through the low pass filters LPF (LPF1 to LPFn).

In the first embodiment, the low pass filters LPF (LPF1 to LPFn) are connected to the cell voltage measurement circuit 22 of the semiconductor device 20 through the cell input terminals V (V1 to Vn) with the cell input signal lines V (V1 to Vn).

In the first embodiment, the cell input signal lines V (V1 to Vn) are connected to the ESD (Electro-Static Discharge) protection diodes (ESD1 to ESDn), respectively. The ESD (Electro-Static Discharge) protection diodes (ESD1 to ESDn) have a function of preventing the cell voltage measurement circuit 22 from being damaged through discharging the high voltage noise due to the electro-static discharge and the like to the terminal Vcc_vn or the power source terminal Vss (the inter-power source ESD protection circuit 24 through the terminal Vcc_vn or the power source terminal Vss).

In the first embodiment, each of the ESD protection diodes (ESD1 to ESDn) is formed of a p-channel type clamp MOS transistor and an n-channel type clamp MOS transistor, of which a gate electrode is connected to a source electrode. The p-channel type clamp MOS transistor has a source connected to the terminal Vcc_cn and a drain connected to the cell input signal line Vn. The n-channel type clamp MOS transistor has a source connected to the power source terminal Vss and a drain connected to the cell input signal line Vn. It should be noted that the ESD protection diodes (ESD1 to ESDn) is not limited to the configuration described above, and may be formed of a MOS with a diode connection.

As described above, in the battery monitoring system 10 in the first embodiment of the present invention, the cell input terminals V (V1 to Vn) are connected to the terminal Vcc_vn and the power source terminal Vss (the inter-power source ESD protection circuit 24 through the terminal Vcc_vn and the power source terminal Vss) through the ESD protection diodes (ESD1 to ESDn), respectively.

As described above, in the first embodiment, the ESD protection diodes (ESD1 to ESDn) are provided for protecting the cell voltage measurement circuit 22 from the electrostatic charge. The present invention is not limited to the ESD protection diodes (ESD1 to ESDn), and may include other type of protection circuit and the like.

In the first embodiment, the cell voltage measurement circuit 22 is connected to the battery cell C1 of the battery cell unit 12 on the lowest potential side through the power source terminal Vss with the power source line Vss and the cell input signal line L0. It should be noted that, in the cell voltage measurement circuit 22, the power source voltage Vss supplied through the power source terminal Vss functions as ground of the internal processing circuit 28 of the cell voltage measurement circuit 22.

In the first embodiment, the power source terminal Vcc of the semiconductor device 20 is connected to the high potential side of the battery cell Cn of the battery cell unit 12 on the highest potential side through the low pass filter LPFvcc. Further, the power source voltage Vcc is supplied to the cell voltage measurement circuit 22 from the high potential side of the battery cell Cn through the low pass filter LPFvcc with the power source terminal Vcc.

In the first embodiment, the terminal Vcc_vn of the semiconductor device 20 is connected to the high potential side of the battery cell Cn of the battery cell unit 12 through the low pass filter LPFvcc_vn.

In the first embodiment, the inter-power source ESD protection circuit 24 has the function of discharging the discharge current from the ESD protection diodes (ESD1 to ESDn) to the terminal Vcc_vn and the power source terminal Vss. It should be noted that as far as the discharge circuit, the configuration of the inter-power source ESD protection circuit 24 is not limited thereto.

In the first embodiment, the cell voltage measurement circuit 22 is not connected to the terminal Vcc_vn. Accordingly, when the discharge current is generated, the discharge current flows through the terminal Vcc_vn. On the other hand, the cell voltage measurement circuit 22 is connected to the power source terminal Vcc. Accordingly, the electrical current constantly flows through the power source terminal Vcc (at least the normal operation when the voltage of the battery cell unit 12 is measured).

In the first embodiment, the low pass filter LPFvcc and the low pass filter LPFvcc_vn have identical characteristics (an identical filter resistivity value and an identical filter capacitance value) to those of the low pass filters LPF (LPF1 to LPFn). Accordingly, a variance in the cell voltage is not generated in the power source terminal Vcc, the terminal Vcc_vn, and the cell input terminals V (V1 to Vn) due to a potential difference caused by a phase difference upon passing through the low pass filters LPF (LPF1 to LPFn).

An operation of the battery monitoring system 10 will be explained next.

As described above, the power source terminal Vcc of the semiconductor device 20 is connected to the cell voltage measurement circuit 22 (the regulator 26). Accordingly, in the normal operation, the electrical current flows through the power source terminal Vcc. When the electrical current flows through the power source terminal Vcc, the voltage drop occurs due to the filter resistor Rn of the low pass filter LPFvcc. As a result, the voltage of the power source terminal Vcc decreases by the voltage drop.

On the other hand, the cell voltage measurement circuit 22 (the regulator 26) as the electrical current driven type circuit is not connected to the terminal Vcc_vn.

Accordingly, the electrical current does not constantly flow through the terminal Vcc_vn. Accordingly, the voltage drop due to the low pass filter LPF does not occur as explained above. As a result, the voltage of the terminal Vcc-vn is maintained.

In the first embodiment, when the voltage of the terminal Vcc-vn is maintained, the voltage of the terminal Vcc-vn does not become smaller than that of the cell input terminal Vn, and does not exceed the forward direction voltage of the ESD protection diode ESDn. As a result, it is possible to prevent the electrical current from flowing from the high potential side of the battery cell Cn to the terminal Vcc_vn through the ESD protection diode ESDn (the inter-power source ESD protection circuit 24 through the terminal Vcc_vn).

As a comparison to the battery monitoring system 10 in the first embodiment of the present invention, an operation of the conventional battery monitoring system 100 (refer to FIG. 5) will be explained next.

Figure 5:
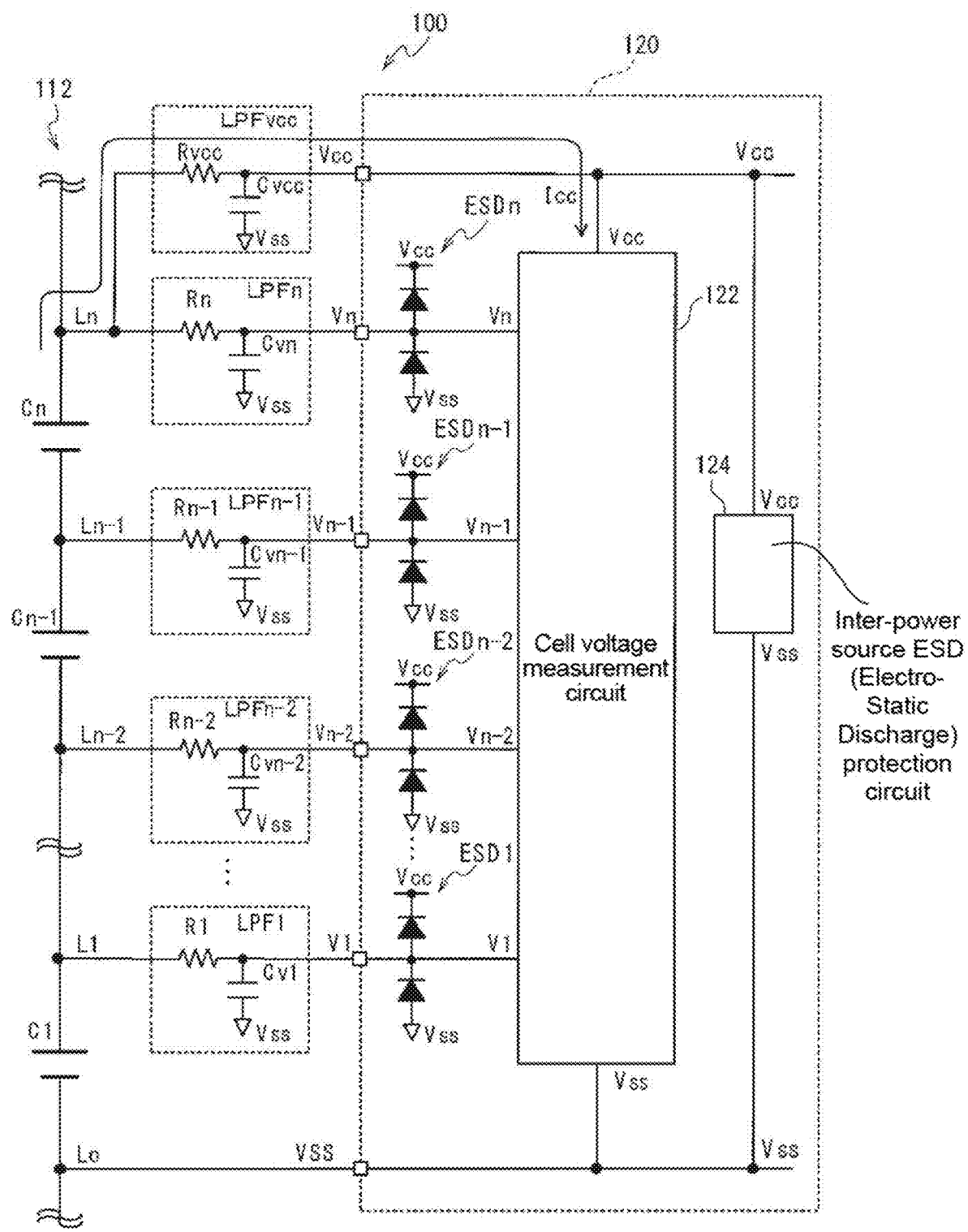
FIG. 5 is a schematic diagram showing a configuration of a conventional battery monitoring system.

As shown in FIG. 5, in the conventional battery monitoring system 100, different from the battery monitoring system 10 in the first embodiment of the present invention, the power source terminal Vcc of the semiconductor device 120 is connected to the high potential side of the battery cell Cn through the low pass filter LPFvcc. Further, the power source terminal Vcc is connected to the battery cell voltage measurement circuit 122 (the regulator in the battery cell voltage measurement circuit 122) and the inter-power source ESD protection circuit 124. Further, in the conventional battery monitoring system 100, the cell input terminals V (V1 to Vn) are connected to the power source terminal Vcc and the power source terminal Vss (the inter-power source ESD protection circuit 124 through the power source terminal Vcc and the power source terminal Vss) through the ESD protection diodes ESD (ESD1 to ESDn), respectively.

In the conventional battery monitoring system 100, the battery cell voltage measurement circuit 122 is connected to the power source terminal Vcc, so that the electrical current constantly flows through the power source terminal Vcc. When the electrical current flows through the power source terminal Vcc, the voltage drop occurs due to the filter resistor Rn of the low pass filter LPFvcc. As a result, the voltage of the power source terminal Vcc decreases by the voltage drop. When the voltage drop exceeds the forward direction voltage of the ESD protection diode ESDn, the electrical current starts flowing from the high potential side of the battery cell Cn to the power source terminal Vcc through the ESD protection diode ESDn (the inter-power source ESD protection circuit 124 through the power source terminal Vcc).

As described above, in the conventional battery monitoring system 100, the electrical current flows into the power source terminal Vcc in the normal operation. In order to prevent the electrical current from flowing into the power source terminal Vcc, it is necessary to minimize the resistivity value of the filter resistor Rvcc of the low pass filter LPFvcc, so that the voltage drop thus generated due to the electrical current does not exceed the forward direction voltage of the ESD protection diode ESDn.

In general, when the low pass filter LPF has a large time constant, the resistivity value of the filter resistor Rvcc of the low pass filter LPFvcc is limited. Accordingly, it is necessary to increase the capacitance value of the capacitor (the filter capacitance) Cvcc. However, due to the restriction in the voltage resistance, the component size, and the like, the capacitance value of the capacitor (the filter capacitance) Cvcc has a limit. Accordingly, the time constant of the low pass filter LPFvcc is restricted. As described above, the low pass filter LPFvcc has the identical characteristics to those of the low pass filters LPF (LPF1 to LPFn), so that the variance in the cell voltage is not generated due to the potential difference caused by the phase difference upon passing through the low pass filters LPF (LPF1 to LPFn). Therefore, the time constant of the low pass filters LPF (LPF1 to LPFn) is consequently restricted.

As described above, in the battery monitoring system 10 in the first embodiment of the present invention, the electrical current does not constantly flow. Accordingly, the voltage drop due to the filter resistor Rvcc vn of the low pass filter LPFvcc-vn does not occur. Therefore, it is possible to increase the resistivity value of the filter resistor Rvcc vn without the restriction. As a result, the time constant of the low pass filter LPFvcc_vn is not restricted. Consequently, in the battery monitoring system 10 in the first embodiment of the present invention, the time constant of the low pass filters LPF (LPF1 to LPFn) is not restricted.

As described above, in the first embodiment of the present invention, in the battery monitoring system 10 having the semiconductor device 20, the cell voltage measurement circuit 22 is connected to the high potential side of each of the battery cells C (C1 to Cn) of the battery cell unit 12 through the low pass filters LPF (LPF1 to LPFn) and the cell input terminals V (V1 to Vn). Further, the high potential side of the battery cell Cn on the highest potential side is connected to the terminal Vcc_vn through the low pass filter LPFvcc_vn, and is connected to the power source terminal Vcc through the low pass filter LPFvcc.

Further, in the battery monitoring system 10 in the first embodiment, the cell voltage measurement circuit 22 is connected to the power source terminal Vcc, and is not connected to the terminal Vcc_vn. The low potential side of the battery cell Cn of the battery cell unit 12 on the lowest potential side is connected to the power source terminal Vss. Further, the inter-power source ESD protection circuit 24 is connected between the terminal Vcc_vn and the power source terminal Vss. The ESD protection diodes ESD (ESD1 to ESDn) are configured to discharge the high voltage noise due to the electro-static charge and the like to the terminal Vcc_vn or the power source terminal Vss (the inter-power source ESD protection circuit 24 through the terminal Vcc_vn or the power source terminal Vss).

As described above, in the first embodiment of the present invention, the inter-power source ESD protection circuit 24 is connected to the power source line Vcc_vn different from the power source line Vcc connected to the electrical current driven type circuit such as the cell voltage measurement circuit 22. In other words, the cell voltage measurement circuit 22 as the electrical current driven type circuit is not connected to the power source line Vcc_vn (the terminal Vcc_vn) that is connected to the inter-power source ESD protection circuit 24. Accordingly, the electrical current does not constantly flow through the terminal Vcc_vn. Accord-ingly, the voltage drop due to the filter resistor Rvcc vn of the low pass filter LPF does not occur, and the voltage of the terminal Vcc_vn does not decrease. Therefore, the difference between the voltage of the terminal Vcc-vn and the potential of the cell input terminal Vn does not exceed the forward direction voltage of the ESD protection diode ESDn. As a result, it is possible to prevent the electrical current from flowing from the high potential side of the battery cell Cn to the terminal Vcc_vn through the ESD protection diode ESDn (the inter-power source ESD protection circuit 24 through the terminal Vcc_vn).

Accordingly, in the first embodiment of the present invention, the time constant of the low pass filters LPF (LPF1 to LPFn) is not restricted by the time constant of the low pass filter LPFvcc and the time constant of the low pass filter LPFvcc_vn.

As described above, in the first embodiment of the present invention, the inter-power source ESD protection circuit 24 is connected to the power source line Vcc_vn. The present invention is not limited to the configuration, and the inter-power source ESD protection circuit 24 may be connected to any power source line as far as the power source line is not connected to the electrical current driven type circuit.

As described above, in the first embodiment of the present invention, the regulator 26 of the cell voltage measurement circuit 22 is connected to the power source terminal Vcc of the semiconductor device 20. The present invention is not limited to the configuration, and other circuit (for example, a processing circuit as a front stage of the regulator 26) may be connected between the power source terminal Vcc and the regulator 26. Further, it is not limited to the regulator 26, and the power source terminal Vcc of the semiconductor device 20 may be connected to any circuit as far as the circuit is the electrical current driven type circuit.

Second Embodiment

Figure 3:
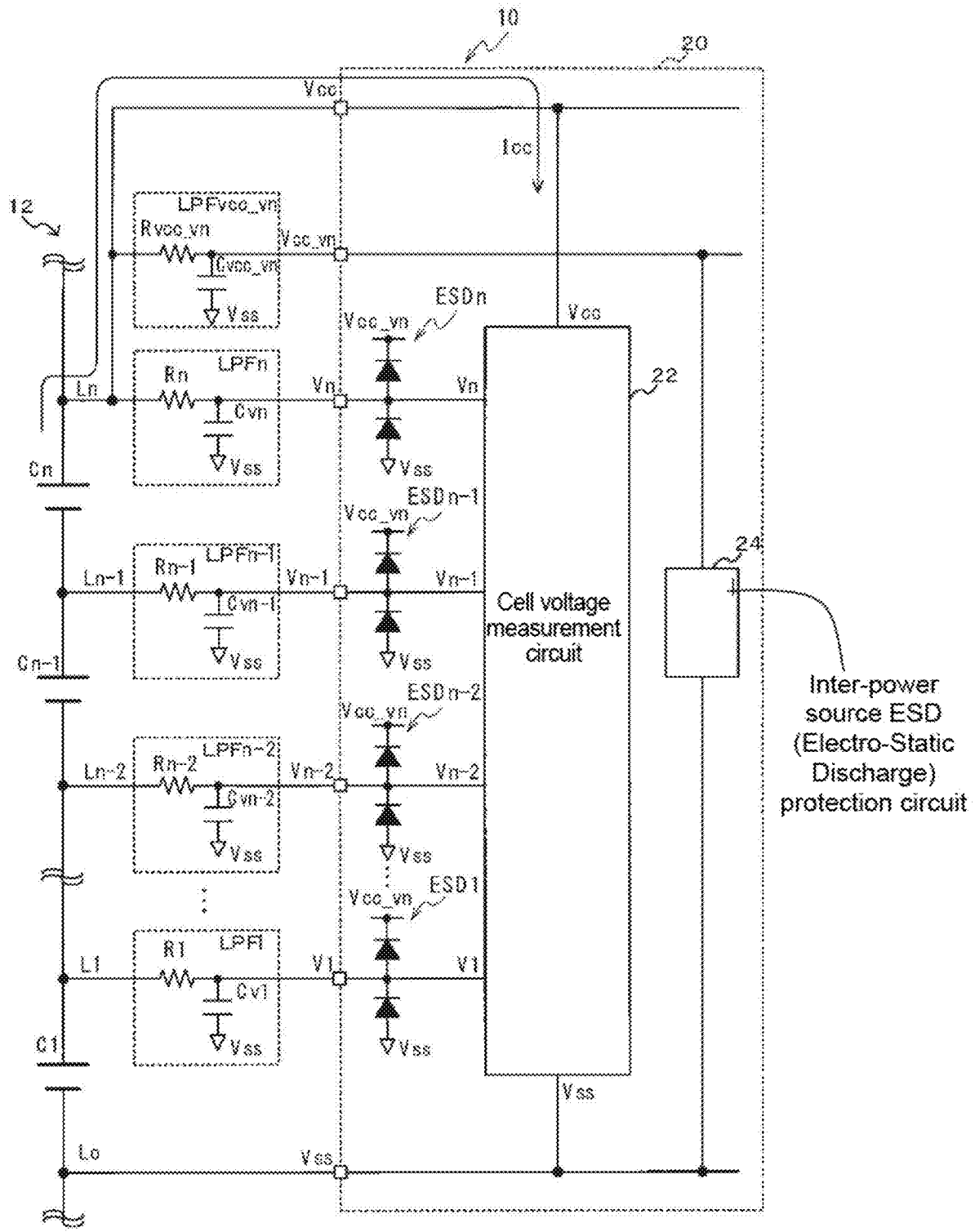
FIG. 3 is a schematic diagram showing a battery cell unit and a semiconductor device of a battery monitoring system according to a second embodiment of the present invention.

A second embodiment of the present invention will be explained next with reference to FIG. 3. FIG. 3 is a schematic diagram showing the battery cell unit 12 and the semiconductor device 20 of the battery monitoring system 10 according to the second embodiment of the present invention.

In the first embodiment, the high potential side of the battery cell Cn is connected to the power source terminal Vcc through the low pass filter LPFvcc. In the second embodiment, as shown in FIG. 3, the high potential side of the battery cell Cn is connected to the power source terminal Vcc without the low pass filter LPFvcc.

In the second embodiment, in the normal operation, it is possible to suppress the electrical current from flowing from the battery cell to the terminal Vcc_vn (the inter-power source ESD protection circuit 24) through the ESD protection diodes ESD. However, a phase difference may be generated between the voltage input to the power source terminal Vcc and the voltage input to the cell input terminals V (V1 to Vn). In such a case, it is preferred that the high potential side of the battery cell Cn is connected to the power source terminal Vcc through the low pass filter LPFvcc.

Third Embodiment

Figure 4:
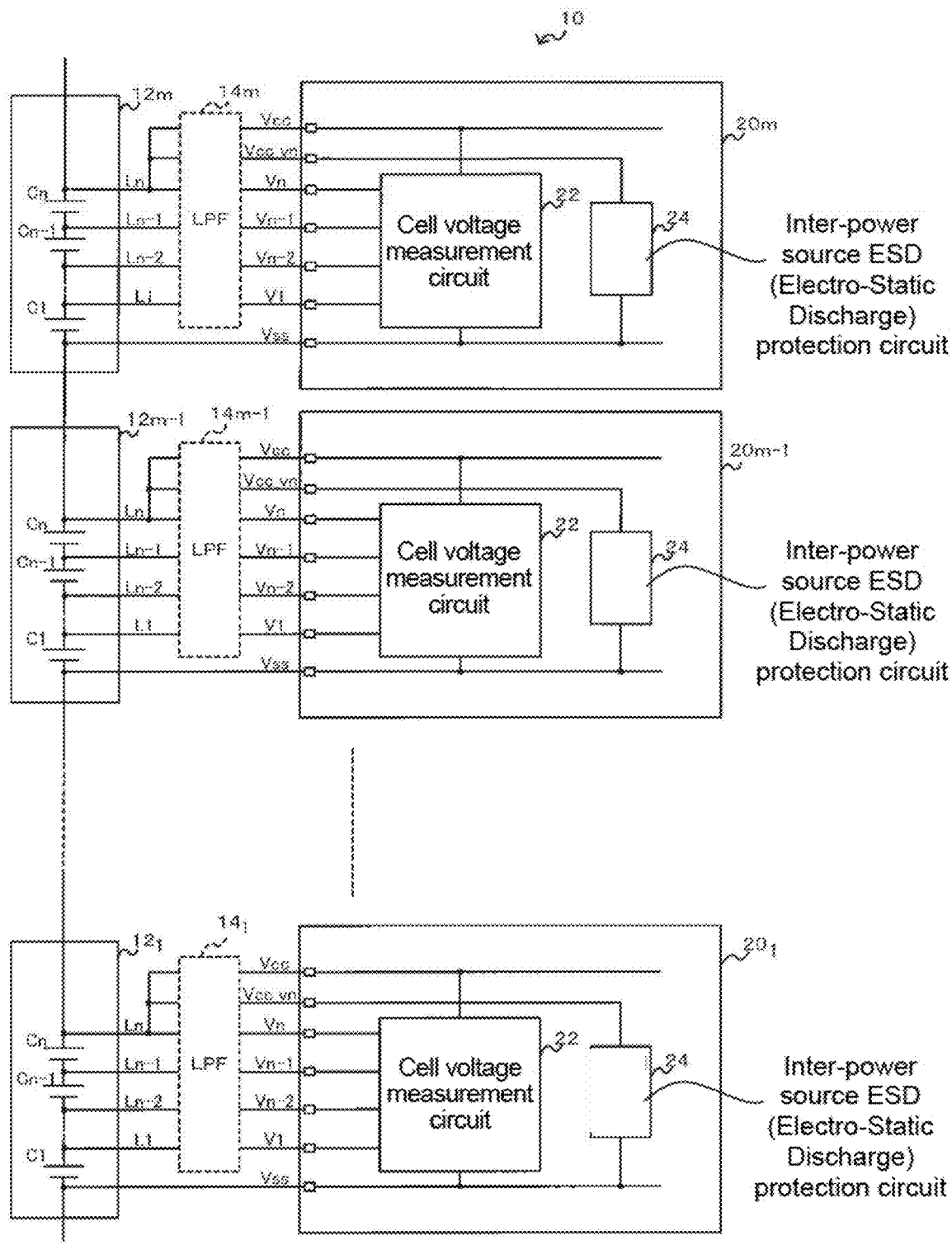
FIG. 4 is a schematic diagram showing a configuration of a battery monitoring system according to a third embodiment of the present invention.

A third embodiment of the present invention will be explained next with reference to FIG. 4. FIG. 4 is a schematic diagram showing a plurality of the battery cell units 121 to 12m and a plurality of the semiconductor devices 201 to 20m of the battery monitoring system 10 according to the third embodiment of the present invention.

In the first embodiment, the battery monitoring system 10 includes one semiconductor device 20. The present invention is not limited to the configuration, and may include a plurality of semiconductor devices and a plurality of battery cell units.

In the third embodiment, as shown in FIG. 4, the battery monitoring system 10 includes a plurality of the battery cell units 121 to 12m and a plurality of the semiconductor devices 201 to 20m.

In the first to third embodiment, the battery monitoring system 10, the semiconductor device 20 and the cell voltage measurement circuit 22 have the specific configurations and perform the specific operations as an example. The present invention is not limited thereto, and may be modified within the scope thereof.

The disclosure of Japanese Patent Application No. 2012-159958, filed on Jul. 18, 2012, is incorporated in the application by reference.

While the invention has been explained with reference to the specific embodiments of the invention, the explanation is illustrative and the invention is limited only by the appended claims.

What is claimed is:

1. A battery monitoring system comprising:
a first group of a plurality of battery cells connected in series and including a first battery cell at a highest potential and a second battery cell at a lowest potential;
a second group of a plurality of battery cells connected in series and including a third battery cell at a highest potential and a fourth battery cell at a lowest potential, the second group of the battery cells being connected to the first group of the battery cells in series; and
first and second semiconductor devices capable of measuring a voltage of the first group of the battery cells and a voltage of the second group of the battery cells, respectively,
wherein the first semiconductor device includes:
a first terminal connected to a high potential side of the first battery cell through a first filter, the first filter being connected to a low potential side of the second battery cell;
a second terminal connected to the high potential side of the first battery cell through a second filter, the second filter being connected to the low potential side of the second battery cell; a first discharge circuit connected to the first terminal; and
a first circuit connected to the second terminal, and
wherein the second semiconductor device includes:
a third terminal connected to a high potential side of the third battery cell through a third filter, the third filter being connected to a low potential side of the fourth battery cell;
a fourth terminal connected to the high potential side of the third battery cell through a fourth filter, the fourth filter being connected to the low potential side of the fourth battery cell;
a second discharge circuit connected to the third terminal; and
a second circuit connected to the fourth terminal.

2. The battery monitoring system according to claim 1, wherein the first semiconductor device further includes:
a plurality of fifth terminals each connected to at least one of a high potential side and a low potential side of each of the first group of the battery cells; and
a plurality of first electro-static protection circuits that each includes one end portion connected to each of the fifth terminals, and another end portion connected to the first discharge circuit, and
wherein the second semiconductor device further includes:
a plurality of sixth terminals each connected to at least one of a high potential side and a low potential side of each of the second group of the battery cells; and
a plurality of second electro-static protection circuits that each includes one end portion connected to each of the sixth terminals, and another end portion connected to the second discharge circuit.

3. The battery monitoring system according to claim 2, wherein the first and second discharge circuits discharge the first and second electro-static protection circuits, respectively.

4. The battery monitoring system according to claim 1, wherein each of the first to fourth filters is a low pass filter formed of a resistor and a capacitor.

5. The battery monitoring system according to claim 1, wherein each of the first electro-static protection circuits includes a plurality of diodes arranged so that a direction toward the first terminal becomes a forward direction thereof, and
wherein each of the second electro-static protection circuits includes a plurality of diodes arranged so that a direction toward the third terminal becomes a forward direction thereof.

* * * * *